United States Patent [19]

Rice et al.

[11] Patent Number: 4,683,161
[45] Date of Patent: Jul. 28, 1987

[54] CERAMIC BODY WITH ORDERED PORES

[75] Inventors: Roy W. Rice; Manfred Kahn, both of Alexandria, Va.; Damian E. Shadwell, Oxon Hill, Md.

[73] Assignee: Piezo Electric Products, Inc., Cambridge, Mass.

[21] Appl. No.: 706,580

[22] Filed: Feb. 28, 1985

[51] Int. Cl.⁴ .................... B32B 3/12; B32B 18/00
[52] U.S. Cl. .................... 428/178; 428/198; 428/210; 428/312.6; 428/312.8; 428/316.6; 428/319.1; 428/446
[58] Field of Search ............. 428/312.6, 312.8, 314.2, 428/317.5, 119, 178, 198, 201, 210, 316.6, 319.1, 446

[56] References Cited

U.S. PATENT DOCUMENTS

| | | | |
|---|---|---|---|
| 3,132,956 | 5/1964 | Lewis | 428/312.6 |
| 3,505,158 | 4/1970 | Murray | 428/312.8 |
| 3,825,468 | 7/1974 | Wojcik et al. | 428/312.8 |
| 3,829,356 | 8/1974 | Rutt | 428/189 |
| 3,926,702 | 12/1975 | Oki et al. | 428/312.8 |
| 4,030,004 | 6/1977 | Rutt | 428/136 |
| 4,071,880 | 1/1978 | Rutt | 428/136 |
| 4,275,102 | 6/1981 | Trojier et al. | 428/119 |
| 4,330,593 | 5/1982 | Shrout et al. | 428/407 |
| 4,353,957 | 10/1982 | Rutt et al. | 428/136 |

FOREIGN PATENT DOCUMENTS 3006393  8/1981  Fed. Rep. of Germany ... 428/312.6

Primary Examiner—William J. Van Balen
Attorney, Agent, or Firm—Joseph S. Iandiorio; William E. Noonan

[57] ABSTRACT

A monolithic ceramic body with ordered pores and a method of making a monolithic ceramic body is provided including applying a fugitive material in a pattern having a predetermined order, size, shape, orientation and location to a broad surface of at least one layer of green ceramic material. A second ceramic layer is juxtaposed in a stack with the first layer, with the fugitive material between the layers. The juxtaposed layers are laminated and the stack is heated to a first temperature to dislodge the fugitive material and provide a plurality of pores having a predetermined order, size, shape, orientation and location which matches that of the fugitive material pattern. The stack is then heated to a second temperature to form a monolithic ceramic body which includes the pores.

18 Claims, 16 Drawing Figures

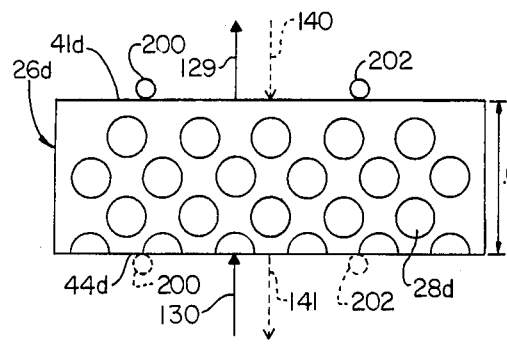
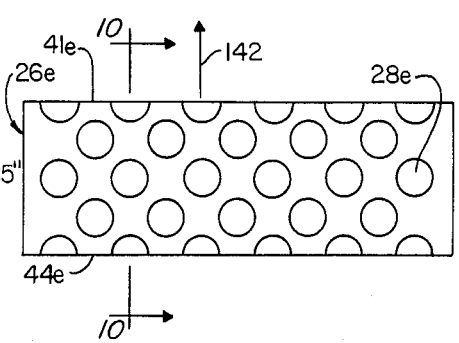
FIG. 8    FIG. 9
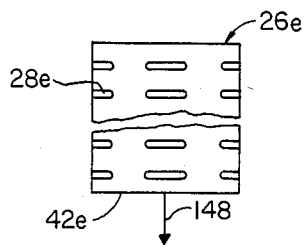
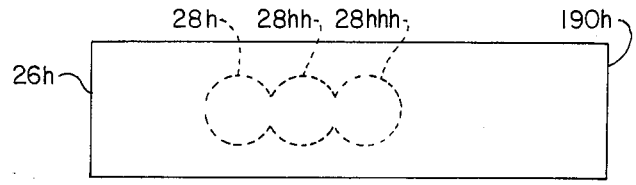
FIG. 10    FIG. 14
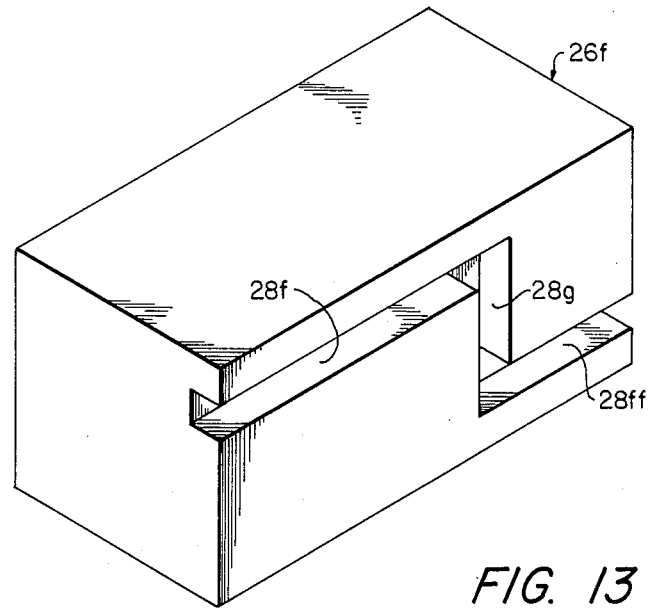
FIG. 13

CERAMIC BODY WITH ORDERED PORES

FIELD OF INVENTION

This invention relates to a ceramic transducer having a plurality of ordered pores and to a method for making such a transducer. More generally, this invention relates to a ceramic body having a plurality of ordered pores and to a method for making such a body.

BACKGROUND OF INVENTION

Conventional piezoelectric ceramic hydrophones have employed relatively incompressible dense materials such as lead zirconate titanate (PZT). Because the hydrostatic sensitivity of such devices is only a fraction of their uniaxial sensitivity, randomly shaped sized and distributed pores have been provided in the ceramic material to enhance its compressibility and thereby the hydrostatic sensitivity. However, such hydrophones exhibit a number of shortcomings. The random pore arrangements tend to weaken the ceramic structure and the devices are susceptible to breaking. Additionally, the hydrophones possess isotropic compression characteristics and it is difficult for them to distinguish the direction of the source of an incoming signal. It would be much more desirable for piezoceramic hydrophones to exhibit anisotropic or directional characteristics. An additional disadvantage occurs because random pores formed on the surface of the ceramic material tend to absorb water, thereby further interfering with the effectiveness of the hydrophone.

Other piezoceramic devices would also benefit from anisotropic properties. For example, piezoelectric bender devices used in fans, motors and generators could have a higher degree of compliance in particular internal regions or directions to effect their desired bending operations. Certain benders have employed a metal core provided with holes. However, this introduces assembly and matching difficulties, e.g. the ceramic and metal exhibit different coefficients of expansion, thereby significantly reducing the advantages of this construction.

Other ceramic devices also suffer from disadvantages due to random porosity. Ceramics are generally weaker under tension than under compression and such materials typically exhibit very little deformation under stress. Accordingly, any imperfection such as a random pore in the ceramic material causes a stress concentration and stress enhancement which often results in cracking.

Random air-filled pores are used to provide heat insulation in refractory ceramics, such as are used in kilns. However, because such porosity weakens the ceramic structure the use of air-filled pores in refractory structures is limited.

There is a device, U.S. Pat. No. 3,829,356, which discloses very large planar voids between ceramic layers. However, only a single such void is provided between each ceramic layer and each void is immediately filled with conductive material to form internal electrodes so that the device can be used as a capacitor.

SUMMARY OF INVENTION

It is therefore an object of the present invention to provide a ceramic body which employs pores in a predetermined order.

It is a further object of this invention to provide a ceramic body that incorporates pores having predetermined size, shape, orientation and location to yield improved elasticity, performance and strength over ceramic bodies of the prior art.

It is a further object of this invention to provide a ceramic body with predetermined anisotropic characteristics.

It is a further object of this invention to provide a method for making an improved ceramic body which permits its physical properties such as compliance, Poisson's Ratio, electrical and thermal conductivity, dielectric constant and piezoelectric coefficients to be precisely predetermined and controlled.

It is a further object of this invention to provide a ceramic body which provides a dense waterproof surface and which resists stress concentrations.

It is a further object of this invention to provide a ceramic body which may be used effectively in refractory structures, load supporting structures, pumps and benders.

It is a further object of this invention to provide an improved electromechanical ceramic transducer having the above advantages.

It is a further object of this invention to provide an electromechanical ceramic transducer which provides enhanced stress resistance, sensitivity, and directionality.

It is a further object of this invention to provide an electromechanical ceramic transducer which employs exclusively internal pores.

It is a further object of this invention to provide an improved hydrophone employing the electromechanical ceramic transducer of this invention.

It is a further object of this invention to provide an improved hydrophone having enhanced hydrostatic sensitivity.

It is a further object of this invention to provide a process for making a monolithic ceramic body having the above advantages.

This invention features a ceramic body which includes a first ceramic portion and a second ceramic portion integrally connected to the first portion. Both portions have a plurality of pores in predetermined order, size, shape, orientation and location in each of at least one plane. Electrode means may be attached at two spaced positions on the body to provide a monolithic electromechanical ceramic transducer according to this invention.

In a preferred embodiment the pores are ordered, sized, shaped, oriented and located to provide an anisotropic ceramic body. At least some of the pores may be at least partly rounded and may be oblate. The pores may be disposed within the ceramic body. Each layer may include a perimetrical region which includes no pores. The pores may be arranged periodically in the body and may be separated from each other. Alternatively, means may be included for interconnecting the pores. The ceramic body may include a piezoceramic material. The ceramic transducer may be used in a monolithic ceramic hydrohone or a ceramic pump.

This invention further features a method of making a monolithic ceramic body including applying a fugitive material in a pattern having a predetermined order, size, shape, orientation and location to a broad surface of at least one layer of ceramic material. A second ceramic layer is juxtaposed in a stack with the fugitive material between the layers and the juxtaposed layers are laminated. The stack is heated to a first temperature to dislodge the fugitive material and provide a plurality of pores having a predetermined order, size, shape, orientation and location which matches that of the fugitive material pattern. The stack is then heated to a second temperature to form a monolithic ceramic body which includes the pores.

It is preferred that the fugitive material be applied in a pattern having an order, size, shape, orientation and location for creating pores which provide an anisotropic ceramic body. The fugitive material may be applied entirely to the internal surfaces of the ceramic layers. It may be applied to provide interconnected pores or separated pores and may be applied in a periodic pattern. The fugitive material may also be applied to provide at least slightly rounded pores or oblate pores. It may include a ceramic such as PZT. The first temperature may be at least 380° C. and the second temperature may be at least 1180° C. Electrode means may also be attached at two spaced positions on the ceramic body. A monolithic electromechanical ceramic transducer may be made by attaching electrode means at two spaced positions on the ceramic body.

Further featured is a monolithic ceramic body and a monolithic electromechanical ceramic transducer made in accordance with the method of this invention.

DISCLOSURE OF PREFERRED EMBODIMENT

Other objects, features and advantages will occur from the following description of a preferred embodiment and the accompanying drawings, in which:

FIG. 8 is a cross-sectional top view of a ceramic body having ordered pores which intersect one side surface;

FIG. 9 is a cross-sectional top view of a ceramic body having ordered pores which intersect two side surfaces;

FIG. 10 is a cross-sectional view taken along lines 10—10 of FIG. 9;

FIG. 13 is an axonometric partly cut away view of a monolithic ceramic body having pores interconnected between a plurality of planes; and FIG. 14 is a top view of a monolithic ceramic body having interconnected internal pores in one plane.

Figure 1:
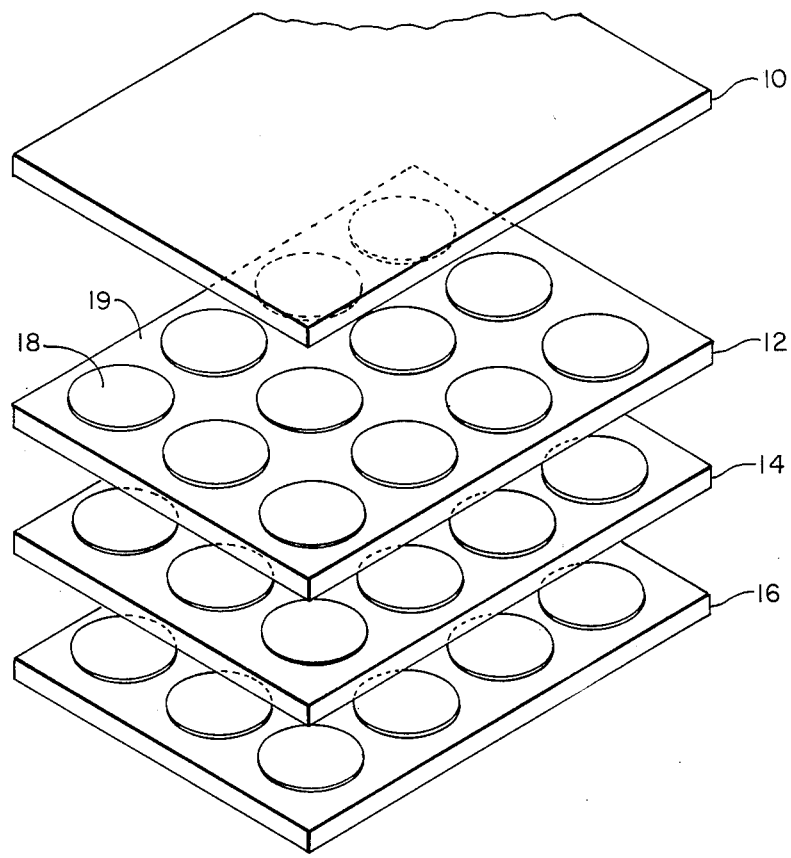
FIG. 1 is an enlarged axonometric view of a plurality of juxtaposed ceramic layers, all but the top one being provided with an ordered pattern of fugitive material.

A ceramic body according to this invention may be made by applying a fugitive material in a pattern having a predetermined order, size, shape, orientation and location to a broad surface of at least one layer of ceramic material. Typically, the ceramic material includes a piezoceramic such as PZT within a 34% binder such as Cerbind (T.M.) No. 73210. The ceramic is formed into very thin tapes or wafers. Such tapes may be fabricated by any one of a number of known methods such as slip-casting or pressing. The fugitive material is then applied to the ceramic material. The fugitive material preferably includes an organic substance which is evaporated or otherwise dislodged under high heat and may include a ceramic such as PZT. The ordered fugitive material patterns are applied to the ceramic layers by one of a number of known methods, e.g. printing, silk-screening, decal deposition, offset printing, pad printing, photolithography.

The ceramic layers are juxtaposed in a stack with the fugitive material between adjacent layers and the layers are laminated, e.g. compressed into intimate contact. The stack may also be heated during this lamination to above, for example, 45° C. Following lamination the stack is heated to a temperature of typically at least 380° C. to evaporate the binder and the fugitive material and provide pores having an ordered pattern which matches the fugitive material pattern. The stack is then heated to a temperature of preferably between 1180° C. and 1300° C. to provide a monolithic ceramic body with ordered pores to which electrode means may be applied to form a transducer.

Typically the fugitive material is applied in a pattern having an order, size, shape, orientation and location which creates pores that provide an anisotropic ceramic body. The pattern may be periodic. It may be applied to provide interconnected or separated pores, and some of the pores may be slightly rounded or oblate. It is often preferred that the pores be disposed entirely internally within the ceramic body.

In another example of the method of this invention, a fugitive material including 22% resin, 27% fine carbon, and 10% PZT powder in an organic solvent is disposed in a pattern on a broad surface of a two-mil-thick layer of ceramic tape. A perimetrical strip 3-20 mils wide and containing no pores is provided around the edge of each ceramic layer. The fugitive material is then permitted to dry, and sixty of these 2-mil layers are juxtaposed in a stack with the fugitive material between pairs of adjacent layers. The stack is preheated for three minutes and the layers are laminated at 1500 psi and 50° C. for five minutes. The stack is then reheated to 60° C. and cut with a sharp blade to provide ceramic bodies of a desired size. The temperature of the cut parts is increased at a rate of 10° C. per hour to 700° C. This dislodges the fugitive material and provides a plurality of pores having a predetermined order, size, shape, orientation and location which matches that of the fugitive material pattern. The stack is then sintered at 1200° for approximately thirty minutes to form a monolithic ceramic body which includes the pores. Because a perimetrical pore-free strip is provided around the edge of each layer, a dense seal is formed around the ordered pores.

Following sintering, the ceramic body may be electroded with silver-bearing paint, dried at 100° C., and poled in silicone fluid at 130° C. in an electric field of 3 kilovolts per millimeter for twenty minutes.

There is shown in FIG. 1 a plurality of ceramic layers 10, 12, 14, and 16. Additional layers, not shown, may be disposed beneath layer 16. Oblate disks 18 of fugitive material are disposed in a pattern having a predetermined order, size, shape, orientation and location to the broad upper surface of each of layers 12, 14 and 16. No fugitive material pattern is applied to top layer 10. Each pattern includes a periodic four by three arrangement of twelve oblate disks. Although each of the patterns shown in FIG. 1 includes such an arrangement, this is not necessarily a limitation of this invention. In alternative embodiments many more than twelve disks may be provided in each layer. That number is shown here for clarity. The fugitive material may also be disposed in various alternate shapes and sizes; a large variety of patterns may be provided, and the pattern may be altered, e.g. provided in squares, bars, spirals, crosses, from layer to layer. A perimetrical edge 19 which includes no fugitive material may be provided on each layer 12, 14 and 16.

Figure 2:
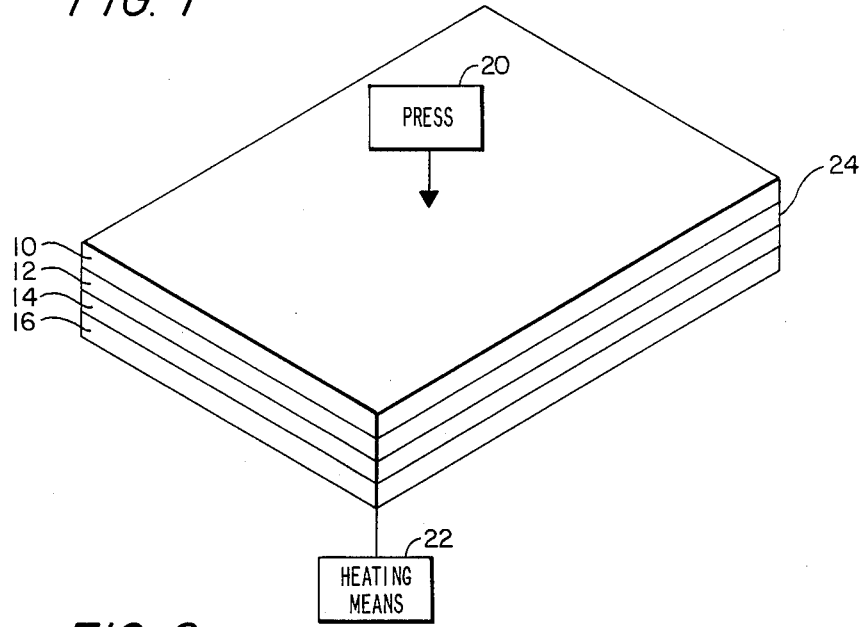
FIG. 2 is an axonometric, partly schematic view of the ceramic layers being compressed into intimate contact and heated.
Figure 3:
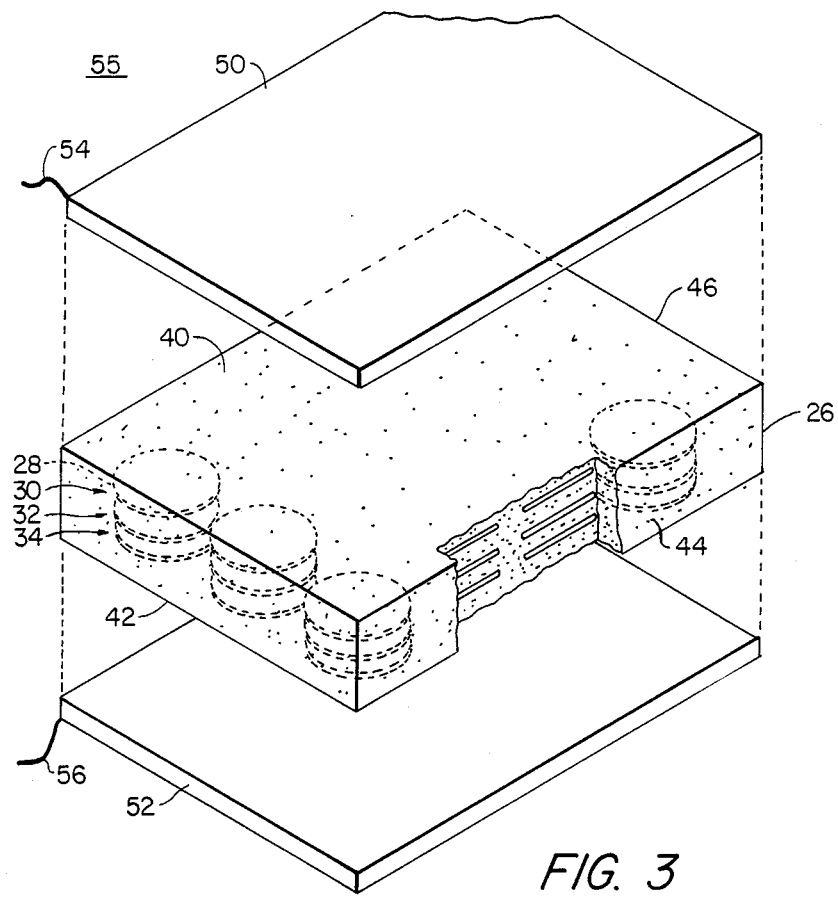
FIG. 3 is an axonometric partly cut away view of electrodes being applied to a monolithic body formed as shown in FIGS. 1 and 2 to provide an electromechanical ceramic transducer according to this invention.

As shown in FIG. 2, the ceramic layers are laminated by press 20, and heat is applied by heating means 22. During lamination the stack is typically heated to approximately 50°-60° C. Laminated stack 24 is then heated to a temperature of above 380° C., which causes the fugitive material disks 18 to evaporate or otherwise dislodge from between the ceramic layers 10, 12, 14 and 16. Stack 24 is sintered at above 1180° C. to form a monolithic ceramic body 26, FIG. 3. This obliterates distinct layers 10, 12, 14 and 16 and merges them into a single body.

Monolithic body 26 includes a plurality of pores 28 having a predetermined order, size, shape, orientation and location which matches that of the evaporated fugitive material pattern, e.g., there are three planes 30, 32 and 34, each including a four-by-three arrangement of pores having a size, shape, orientation and location which matches that of the pattern of fugitive material 18 of FIG. 1. Because no fugitive material is provided on the top of ceramic layer 10 of FIG. 1 and because a perimetrical nonporous edge 19 is provided around each layer 12, 14 and 16, the resulting pores 28 are contained entirely internally within ceramic body 26 and no pores appear on the outside surfaces (e.g., top and bottom surfaces 40 and 42 and side surfaces 44 and 46) of body 26.

Following formation of body 26 upper and lower electrodes 50 and 52, are applied to upper and lower ceramic surfaces 40 and 42, respectively, and conducting wires 54 and 56 are attached to form ceramic transducer 55.

Figure 4:
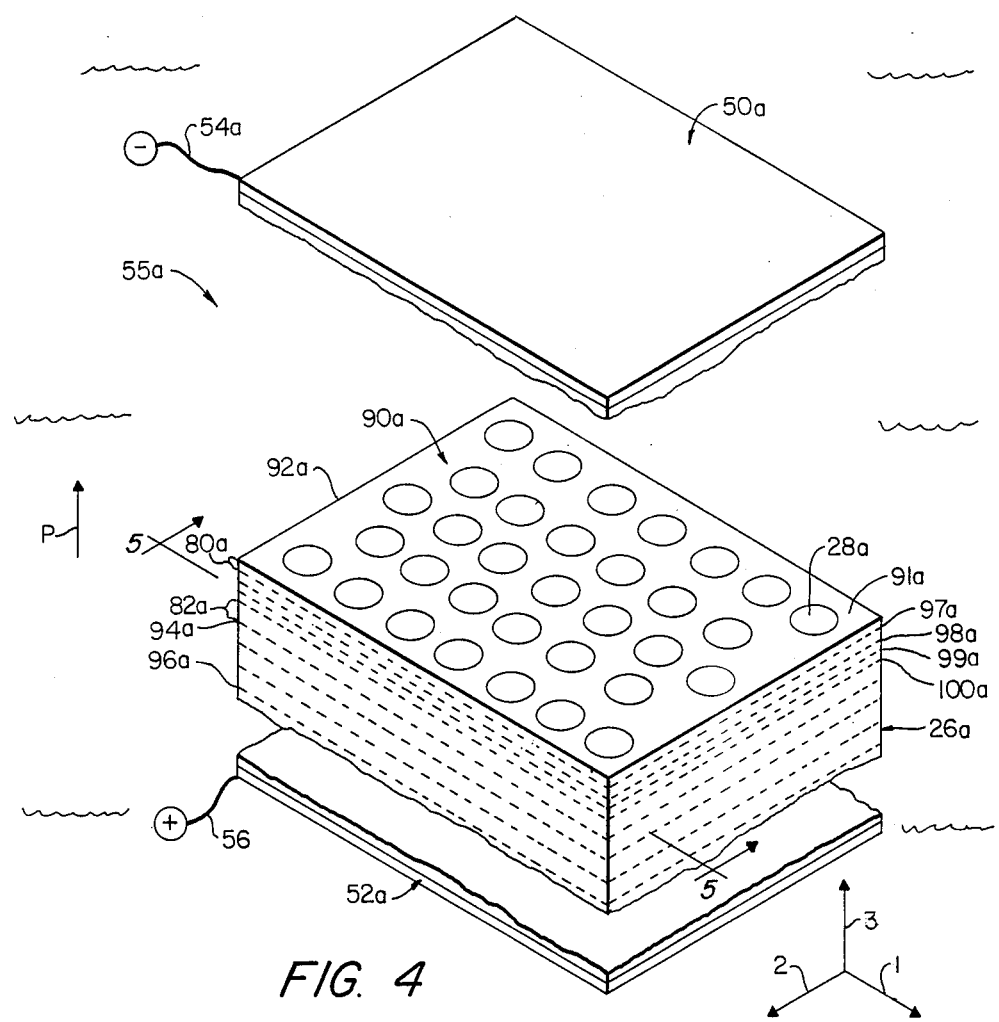
FIG. 4 is a simplified partly cut away axonometric view of a piezoceramic hydrophone having ordered patterns of pores according to this invention.

There is shown in FIG. 4 a piezoceramic hydrophone 55a which includes a monolithic piezoceramic body 26a manufactured according to the method of this invention. Body 26a is formed from one hundred twenty 1-mil thick piezoceramic layers 80a or, alternatively, sixty 2-mil thick piezoceramic layers 82a. These original layers are shown in phantom for purposes of clarity and illustration only; in fact the distinct layers are sintered and the individual layer identities are obliterated when the stack is sintered and forms monolithic body 26a as described above. Upper electrode 50a is applied to the top surface of body 26a and a lower electrode 52a is applied to the bottom surface of piezoceramic body 26a. Respective wire conductors 54a and 56a interconnect the electrodes with appropriate circuitry. The hydrophone 55a is oriented by axes 1, 2 and 3, shown in the lower right of the drawing, and is poled in the direction of arrow P from electrode 52a to electrode 50a, e.g. along the 3 axis. In the hydrophone art the 3 axis always extends parallel to the poling direction and the 1 and 2 axes are perpendicular to the poling direction.

The sensitivity of hydrophone 55a is determined by measuring the following values:

(1) $d_h$ (piezoelectric hydrostatic charge coefficient—the ratio of charge generated to hydrostatic force applied). It may be determined from $d_{33}-d_{32}-d_{31}$, where $d_{33}$ is the ratio of the electric charge collected at the electrodes to a force applied along the 3 axis; $d_{32}$ is the ratio of the electric charge collected at the electrodes to a force applied along the 2 axis; and $d_{31}$ is the ratio of the charge collected at the electrodes to a force applied along the 1 axis. $d_h$ may be measured directly or indirectly by measuring $d_{33}$, $d_{32}$, and $d_{31}$.

(2) $K_3$ (dielectric constant along the 3 axis)

(3) $$\frac{d_{31} + d_{32}}{2d_{33}}$$

(which is equivalent to Poisson's Ratio)

(4) $g_h$ (piezoelectric hydrostatic voltage coefficient)$=\epsilon d_h/_0 K_3$, where $\epsilon_0 = 8.85 \times 10^{-12}$ farads/meter. The gh value is calculated from $K_3$, $d_h$ and $\epsilon_0$.

Increases in the value of $d_{33}$ and decreases in the values of $$\frac{d_{31} + d_{32}}{2d_{33}}$$

and $K_3$ result in increased values for $g_h$ and indicate an increase in the voltage sensivity of the transducer.

The effect of employing the ordered pores of this invention in hydrophone 55a is illustrated by the following examples.

EXAMPLE 1

If hydrophone 55a is not provided with pores, its compliance or compressibility is approximately the same along the 1, 2 and 3 axes, e.g., the device behaves isotropically. The following parameters are exhibited by such a hydrophone:

$$\frac{d_{31} + d_{32}}{2d_{33}} = .44$$

$K_3 = 1132$
$d_h = 33 \times 10^{-12}$ meters/volt
$g_h = \epsilon d_h/_0 K_3 = 3.3 \times 10^{-3}$ volt meters/newton

EXAMPLE 2

To enhance the hydrostatic sensitivity, an ordered pattern 90a of oblate pores 28a, FIG. 4, having a predetermined size, orientation and location are provided. This pattern is formed by applying fugitive material that does not contain PZT powder to every third 2-mil thick layer 82a. Following sintering and evaporation of the fugitive material a pattern 90a of pores is provided at planes 92a, 94a, 96a, and other (omitted in the drawing) pore planar intervals spaced 0.0039 in. apart. The pores are 0.024 inch in horizontal diameter and have a center-to-center spacing of 0.03 inches. Their thickness (in the direction of the 3 axis) is 0.0005 inches.

Figure 5:
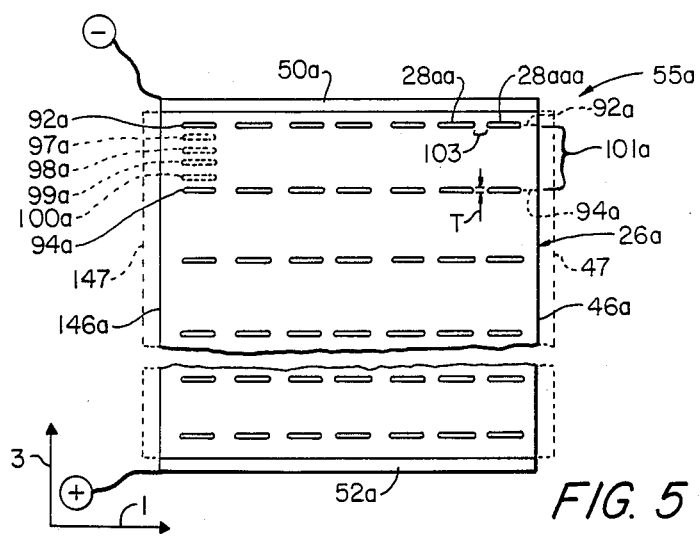
FIG. 5 is a simplified cross-sectional view taken along line 5—5 of FIG. 4.

Due to this ordered pore pattern, hydrophone 55a exhibits anisotropic compression characteristics. For example, as shown in FIG. 5, the spacing 101a between adjacent planes, e.g. 92a, 94a, of pores 28a is more than six times larger than the thickness T of the oblate pores. The solid area between the pores in each horizontal plane, e.g. 92a, is only twice the pore area of the plane. As a result, horizontal columns of piezoceramic material within spacing 101a have three times the fractional area of the vertical columns within spacing 103. Moreover, the pores 28a are much more compressible at 90° to planes 92a, 94a, etc., than they are parallel to these planes. As a result, body 26a is more compressible and therefore more sensitive along the 3 axis than along the 1 axis.

Enhanced hydrostatic sensitivity is further evidenced by the following measurements determined for a hydrophone employing the above pore pattern.

$$\frac{d_{31} + d_{32}}{2d_{33}} = 0.26$$

$K_3 = 550$
$d_h = 89 \times 10^{-12}$ meters/volt
$g_h = 18.5 \times 10^{-3}$ volt meters/newton Therefore, the hydrophone employing pattern 90a at layers 92a, 94a, and 96a exhibits higher values of $d_h$ and $g_h$ and lower values of $K_3$ and $$\frac{d_{31} + d_{32}}{2d_{33}}$$

than are exhibited by the hydrophone containing no ordered pores, and this results in enhanced hydrostatic sensitivity and improved sensing directionality.

The anisotropic effect of the ordered pore construction is further evidenced by poling in the direction parallel to the major pore planes 92a, 94a, etc., e.g., by applying electrodes 47, 147, shown in phantom, along sides 46a and 146a, FIG. 5. The measured dielectric constant in this direction is 840, which is much closer to the value for a piezoceramic having no pores at all than to the above value $K_3$ in the direction perpendiclar to the major pore planes. Likewise, the value for $$\frac{d_{31} + d_{32}}{2d_{33}}$$

after poling in the directlon parallel to the pore planes 92a, 94a, is 0.37, as compared to 0.26 after poling in the direction perpendicular to the pore planes, i.e. from electrode 52a to 50a. This indicates a much lower compliance and sensitivity in the direction parallel to pore planes 92a, 94a, etc., than in the direction perpendicular to those planes.

EXAMPLE 3

Ordered pore pattern 90a, FIG. 4, is provided between 1-mil thick piezoceramic layers 80a, e.g., fugitive material containing PZT powder is disposed between each 1-mil thick layer and pores 28a are therefore produced at planes 92a, 97a, 98a, 99a, 100a, etc.

As shown in phantom in FIG. 5, the spacing between successive planes 92a, 97a, 98a, 99a, 100a, and 94a of ordered pores is closer than in the previous example. This provides more layers of soft pores, and therefore the compressibility is even greater in the direction of the 3 axis than in the prior example. The following measurements are obtained:

$$\frac{d_{31} + d_{32}}{2d_{33}} = .13$$

$K_3 = 316$
$d_h = 139 \times 10^{-12}$ meters/volt
$g_h = 50 \times 10^{-3}$ volt meters/newton The charge and voltage coefficients are greater, and therefore sensitivity is enhanced even further.

EXAMPLE 4

Figure 6:
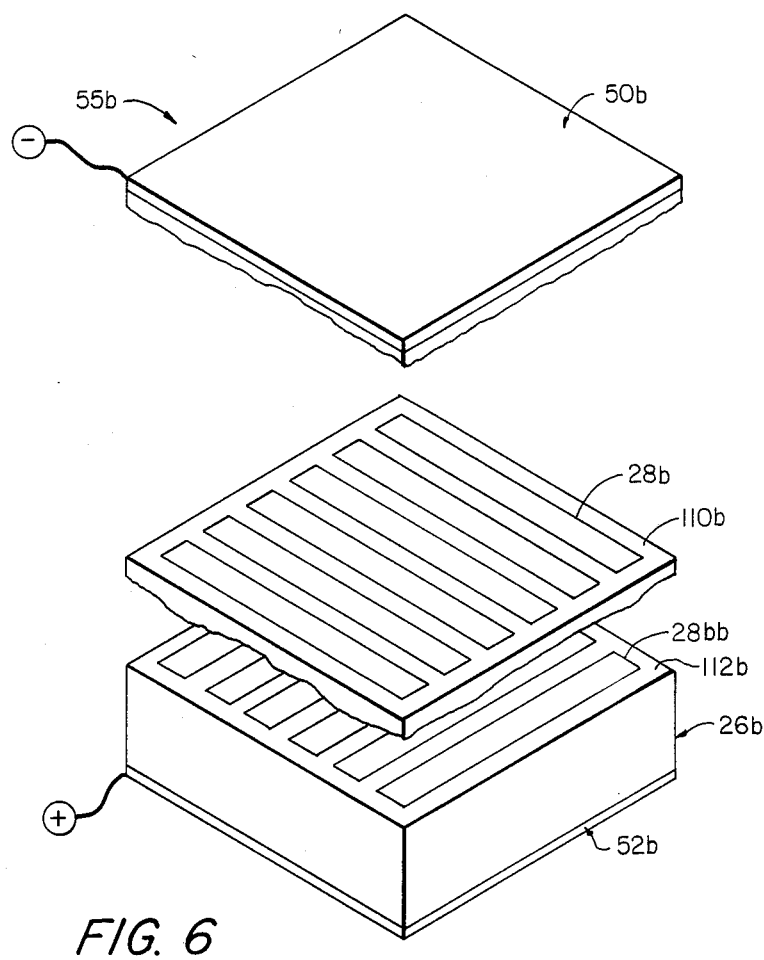
FIG. 6 is an partly cut away axonometric view of an alternative piezoceramic hydrophone having elongate pores.

As shown in FIG. 6, hydrophone 55b includes a ceramic body 26b which is made up on one hundred twenty 1-mil layers or sixty 2-mil layers as described above. Between the ceramic layers fugitive material is arranged in ordered elongate patterns so that after sintering, pores 28b and pores 28bb, which extend at right angles to pores 28b, are provided in alternating adjacent planes 110b, 112b. The elongate pores of each plane are therefore oriented at 90° relative to the pores of the planes above and below it. Again electrodes 50b and 52b are applied to the upper and lower surfaces of ceramic body 26b.

The values measured for this hydrophone are as follows:

$$\frac{d_{31} + d_{32}}{2d_{33}} = .08$$

$g_h = 100 \times 10^{-3}$ volt meters/newton
$K_3 = 120$
$d_h = 106 \times 10^{-12}$ meters/volt Additionally, body 26b exhibits anisotropic compression characteristics. The estimated compliance along the 1 axis is approximately 110% of that along the 1 axis of a block without ordered pores. However, the estimated compliance along the 3 axis is 800%–1200% of the compliance along the same axis of a block having no ordered pores.

A body employing layers of entirely parallel pores 28b evidences anisotropic compression characteristics along the 3 axis, the 1 axis and the 2 axis.

In each of the embodiments of FIGS. 4, 5 and 6, perimetrical nonporous regions 19a and 19b enclose the respective pores to form watertight outer surfaces of hydrophones 55a and 55b.

Figure 7:
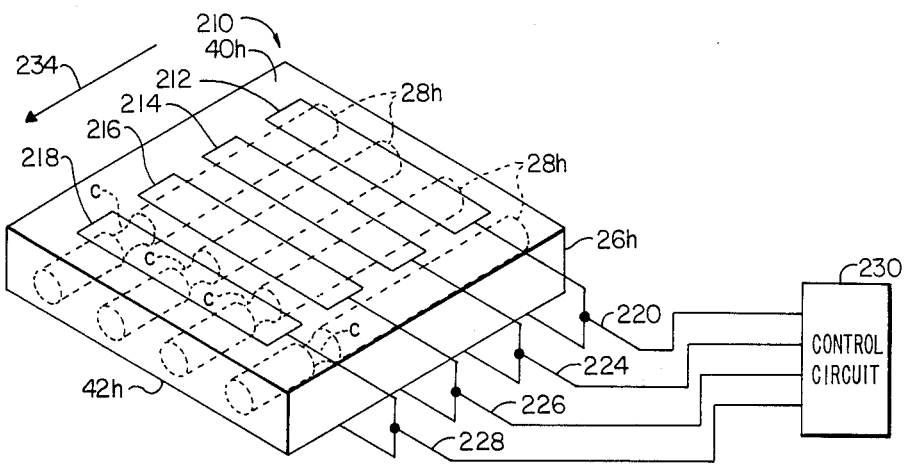
FIG. 7 is a schematic view of a piezoceramic pump which employs ordered pores.

A low volume pump 210 which employs elongate tubular ordered pores 28h is shown in FIG. 7. Piezoceramic monolithic body 26h is constructed according to the method of this invention and is provided with strips of electrode pairs 212, 214, 216 and 218, on its upper and lower surfaces 40h, 42h (lower electrodes, not shown). The electrodes are arranged perpendicular to the pores 28h and each pair of upper and lower electrodes is connected by a respective conductor 220, 224, 226, and 228 to a microprocessor control circuit 230. Voltage is applied sequentially to each of electrode pairs 212–218. This causes the piezoceramic material to constrict so that constrictions C travel along pores 28h in the direction of arrow 234 to pump fluid through the pores.

The use of ordered pores according to this invention also increases the strength of ceramic transducers and ceramic load supporting and refactory structures. As shown in FIG. 8, piezoceramic body 26d having a width of 0.085 inches is provided with sixty layers of 0.01 inch diameter pores 28d spaced at 0.013 inch intervals. The pores are similar in shape to those shown in FIG. 2, except that some of them intersect side surface 44d of body 26d. A three-point flexure test is performed to measure the strength of the respective surfaces 41d, 44d. First a tensile force 129 is applied to surface 41d by supporting surface 41d against elements 200, 202 and applying a compressive force 130 against surface 44d. The flexure strength measured for surface 41d is 70 megapascals (MPa). The flexure strength in a body constructed identically to body 26d but without ordered pores is only 45 MPa. Flexing body 26d in the opposite direction, e.g., placing elements 200, 202 as shown in phantom against surface 44d and applying a compressive force 140 to surface 41d, and a resultant tensile force 141 to surface 44d, indicates a flexure strength for surface 44d of 117 MPa: the same surface without pores exhibits a flexure strength of only 51 MPa.

Body 26e, FIG. 9, having an identical structure and size, is provided with ordered pores 28e which intersect both elongate side surfaces 41e and 44e of the body. Again, the pores are 0.01 inch in diameter. Surface 41e is flexed in the direction of arrow 142 and a flexure strength of 121 MPa is indicated. The flexure strength of this surface absent ordered pores is only 64 MPa. In another flexure test mode, bottom surface 42e is flexed in the direction of arrow 148, as shown in FIG. 10, to reveal a flexure strength of 114 MPa. Again, the strength of this surface in a body without ordered pores is only 79 MPa. The provision of ordered pores significantly enhances the flexure strength of piezoceramic bodies.

Figure 11A:
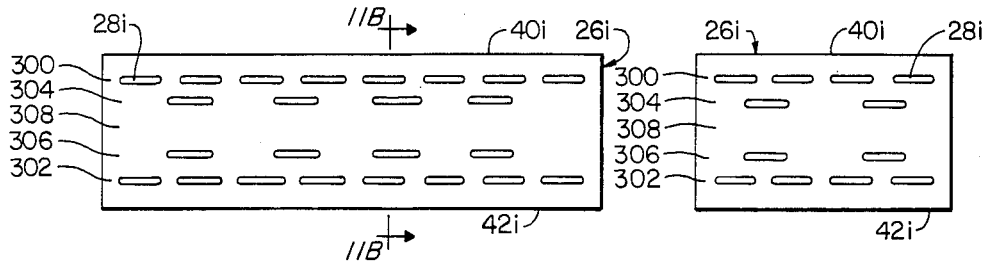
FIG. 11A is a cross-sectional side view of a monolithic ceramic body having ordered pores concentrated proximate its upper and lower surfaces.
Figure 11B:
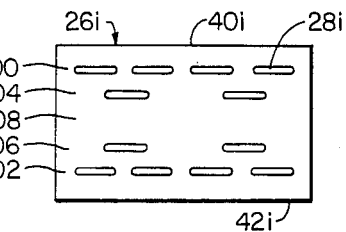
FIG. 11B is a cross-sectional view taken along line 11B—11B of FIG. 11A.

By arranging the pores in various ordered patterns, desired strength characteristics may be achieved. For example, as shown in FIGS. 11A and 11B, pores 28i are concentrated in upper and lower planes 300, 302 of ceramic body 26i and are less densely provided in interior layers 304, 306. Center region 308 includes no pores at all. Body 26i is relatively compliant proximate upper and lower surfaces 4oi, 42i, and relatively stiff at center region 308.

Figure 12A:
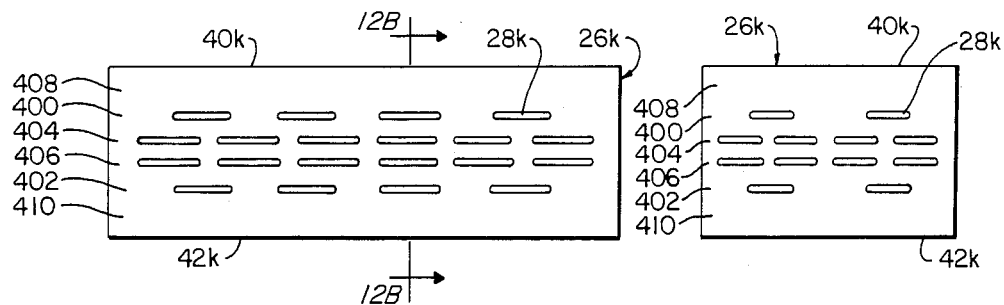
FIG. 12A is a cross-sectional side view of a monolithic ceramic body having ordered pores concentrated proximate its center.
Figure 12B:
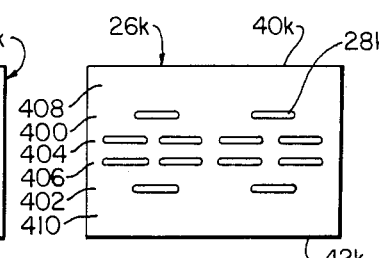
FIG. 12B is a cross-sectional view taken along line 12B—12B of FIG. 12A.

Alternatively, as shown in FIGS. 12A and 12B, pores 28k may be densely arranged in interior planes 404, 406 and less densely arranged in planes 400, 402. Regions 408, 410 proximate surfaces 40k, 42k include no pores. This provides a body 26k which is relatively stiff proximate upper and lower surfaces 40k, 42k and relatively compliant at its center.

Various other pore patterns (which may be generated by computer or otherwise) may be provided to achieve desired strength and compliance characteristics in transducers such as benders and in ceramic load supporting structures. The enhanced strength provided by ordered pore arrangements is also particularly beneficial in refractory ceramic structures such as kilns. Ordered pores filled with air provide enhanced thermal insulation while maintaining strength of the ceramic. The ceramic body of this invention may also be employed on electronic signal processing applications, e.g., as part of the processing circuitry.

The ordered pores may be interconnected; for example, as shown in FIG. 13, pores 28f and 28ff on entirely different planes of body 26f may be interconnected by a transverse pore 28g. Alternatively, as shown in FIG. 14, adjacent pores 28h, 28hh, and 28hhh in a single plane 190h may be interconnected.

The dimensions, sizes, shapes, orientations and locations given in the examples described above are provided for illustrative purposes only. The ordering of the pores may be adjusted to provide desired physical and anisotropic characteristics for the ceramic transducer.

Although specific features of the invention are shown in some drawings and not others this is for convenience only as each feature may be combined with any or all of the other features in accordance with the invention.

Other embodiments will occur to those skilled in the art and are within the following claims:

What is claimed is:

1. A ceramic body comprising: a first ceramic portion; and a second ceramic portion integrally connected to said first portion; each of said first and second portions having a plurality of substantially flat pores in predetermined order, size, shape, orientation and location in at least one discrete plane which provide an anisotropic ceramic body.

2. The body of claim 1 in which at least some of said pores are at least partly rounded.

3. The body of claim 1 in which at least some of said pores are oblate.

4. The body of claim 1 in which said pores are disposed entirely internally within said ceramic body.

5. The body of claim 1 in which each plane includes a perimetrical region which includes no pores.

6. The body of claim 1 further including means for interconnecting said pores.

7. The body of claim 1 in which said pores are arranged periodically in said body.

8. The body of claim 1 in which said pores are separated from each other.

9. The body of claim 1 in which there are disposed a plurality of pore planes and the distance between each adjacent plane of pores is greater than the thickness of any individual pore.

10. A ceramic body comprising: a first ceramic portion; and a second ceramic portion integrally connected to said first portion; each of said first and second portions having a plurality of pores in predetermined order, size, shape, orientation and location in at least one discrete plane and a plurality of non-porous columns perpendicularly intersecting each said pore plane to provide an anisotropic ceramic body.

11. The body of claim 10 in which at least some of said pores are at least partly rounded.

12. The body of claim 10 in which at least some of said pores are oblate.

13. The body of claim 10 in which said pores are disposed entirely internally within said ceramic body.

14. The body of claim 10 in which each plane includes a perimetrical region which includes no pores.

15. The body of claim 10 further including means for interconnecting said pores.

16. The body of claim 10 in which said pores are arranged periodically in said body.

17. The body of claim 10 in which said pores are separated from each other.

18. A ceramic body comprising: a first ceramic portion; and a second ceramic portion integrally connected to said first portion; each of said first and second portions having a plurality of substantially flat pores in predetermined order, size, shape, oreintation and location in at least one discrete plane and a plurality of non-porous columns perpendicularly intersecting each said pore plane to provide an anisotropic ceramic body.

* * * * *